United States Patent
Parameswaran et al.

(10) Patent No.: US 7,217,889 B1
(45) Date of Patent: May 15, 2007

(54) SYSTEM AND METHOD FOR REDUCING CROSSTALK BETWEEN VIAS IN A PRINTED CIRCUIT BOARD

(75) Inventors: Gopakumar Parameswaran, Santa Clara, CA (US); Cuong C. Ly, Newark, CA (US); Douglas L. Yanagawa, Los Altos, CA (US); Mark N. Yamashita, San Jose, CA (US); Yuval Bachar, Sunnyvale, CA (US)

(73) Assignee: Cisco Technology, Inc., San Jose, CA (US)

( * ) Notice: Subject to any disclaimer, the term of this patent is extended or adjusted under 35 U.S.C. 154(b) by 356 days.

(21) Appl. No.: 10/727,381

(22) Filed: Dec. 4, 2003

(51) Int. Cl.
*H01R 12/04* (2006.01)
*H05K 1/11* (2006.01)

(52) U.S. Cl. ..................... 174/261; 174/262
(58) Field of Classification Search ........ 174/262–266, 174/261; 361/792–795
See application file for complete search history.

(56) References Cited

U.S. PATENT DOCUMENTS

| | | | |
|---|---|---|---|
| 5,646,368 A * | 7/1997 | Muyshondt et al. | 174/33 |
| 6,008,534 A * | 12/1999 | Fulcher | 257/691 |
| 6,641,411 B1* | 11/2003 | Stoddard et al. | 439/108 |
| 6,743,985 B1* | 6/2004 | Greim et al. | 174/261 |
| 2002/0130739 A1* | 9/2002 | Cotton | 333/238 |
| 2002/0179332 A1* | 12/2002 | Uemetsu et al. | 174/262 |
| 2003/0147375 A1 | 8/2003 | Goergen et al. | 370/351 |
| 2004/0150970 A1* | 8/2004 | Lee | 361/794 |
| 2005/0077977 A1* | 4/2005 | Weale et al. | 333/5 |

OTHER PUBLICATIONS

Green, Lynne, pcb-update, "Crosstalk for Printed Circuit Board Designers," http://asp.pcb-update.com/data/newsletter/pcb-update-news-vol-2.pdf, Jan. 2001, pp. 1-12.
Cadence Design Systems, Inc., "Inside Differential Signals," Cadence Community Education Series—Dec. 2001, http://www.spectraquest.com/Downloads/InsideDiffSigals_Green.qxd.pdf, pp. 1-4.
Belopolsky, Yakov and Ellis, John, FCI Electronics, Inc., "Modular Connectors For High Speed Differential Signal Transmission," http://www.fciconnect.com/products/technical_01_06.asp, pp. 1-12 (printed on Nov. 19, 2003).

* cited by examiner

*Primary Examiner*—Tuan Dinh
*Assistant Examiner*—Jeremy C. Norris
(74) *Attorney, Agent, or Firm*—Campbell Stephenson Ascolese LLP; Brenna A. Brock

(57) ABSTRACT

Two pairs of vias are arranged in a printed circuit board. A first pair of vias, which conveys a first signal pair, is arranged in a plane that is substantially equidistant from the vias in a second pair of vias, which conveys a second signal pair. Similarly, the second pair of vias is located in a plane that is substantially equidistant from each via in the first pair of vias. In some embodiments, such an arrangement reduces the crosstalk effect of the first signal pair on the second signal pair and vice versa.

44 Claims, 5 Drawing Sheets

SYSTEM AND METHOD FOR REDUCING CROSSTALK BETWEEN VIAS IN A PRINTED CIRCUIT BOARD

FIELD OF THE INVENTION

The present invention relates to printed circuit board and, more specifically, to the arrangement of vias in a printed circuit board.

BACKGROUND

Printed circuit board (PCB) design is becoming increasingly complex due to a variety of factors. Such factors include increasing data rates of signals conveyed by printed circuit boards, increasing numbers of I/O signals per integrated circuit, decreasing sizes of printed circuit boards and integrated circuits, decreasing space between integrated circuits on printed circuit boards, increasing numbers of layers within printed circuit boards, and increasing printed circuit board thickness. Many of these factors lead to increasing trace and via density within printed circuit boards.

Due to the combination of increases in trace and via density increases and as increases in signal data rates, traces and vias are experiencing increased amounts of crosstalk. Crosstalk occurs when signals being routed by neighboring signal lines interfere with each other. Crosstalk leads to increased signal noise, and this noise makes it more difficult for a receiver to correctly interpret the signal.

In the past, crosstalk has been reduced by maintaining an amount of separation or isolation between traces and vias such that the crosstalk between signals conveyed by those traces and vias was minimized. Vias can be isolated by creating a virtual ground plane between vias. Typically, it is easier for designers to provide more space and/or more isolation between traces than it is between vias, especially in areas of high via density, such as the area underneath a set of ball grid array connectors used to couple an integrated circuit to the printed circuit board. Accordingly, it is desirable to be able to decrease the crosstalk between vias in a printed circuit board.

SUMMARY

Various embodiments of systems and methods are disclosed for arranging vias in a printed circuit board. A first pair of vias, which conveys a first signal pair, is arranged in a plane that is substantially equidistant from the vias in a second pair of vias, which conveys a second signal pair. Similarly, the second pair of vias is located in a plane that is substantially equidistant from each via in the first pair of vias. In some embodiments, such an arrangement reduces the crosstalk effect of the first signal pair on the second signal pair. This in turn allows the first and second pairs of vias to be arranged more densely than would be possible in a traditional via arrangement that experiences the same amount of crosstalk (e.g., in a traditional via arrangement, the first and second pairs of vias might need to separated by ground vias in order to achieve the same amount of crosstalk reduction).

The foregoing is a summary and thus contains, by necessity, simplifications, generalizations and omissions of detail; consequently, those skilled in the art will appreciate that the summary is illustrative only and is not intended to be in any way limiting. The operations disclosed herein may be implemented in a number of ways, and such changes and modifications may be made without departing from this invention and its broader aspects. Other aspects of the present invention, as defined solely by the claims, will become apparent in the non-limiting detailed description set forth below.

BRIEF DESCRIPTION OF THE DRAWINGS

A more complete understanding of the present invention may be acquired by referring to the following description and the accompanying drawings, in which like reference numbers indicate like features.

Figure 1:
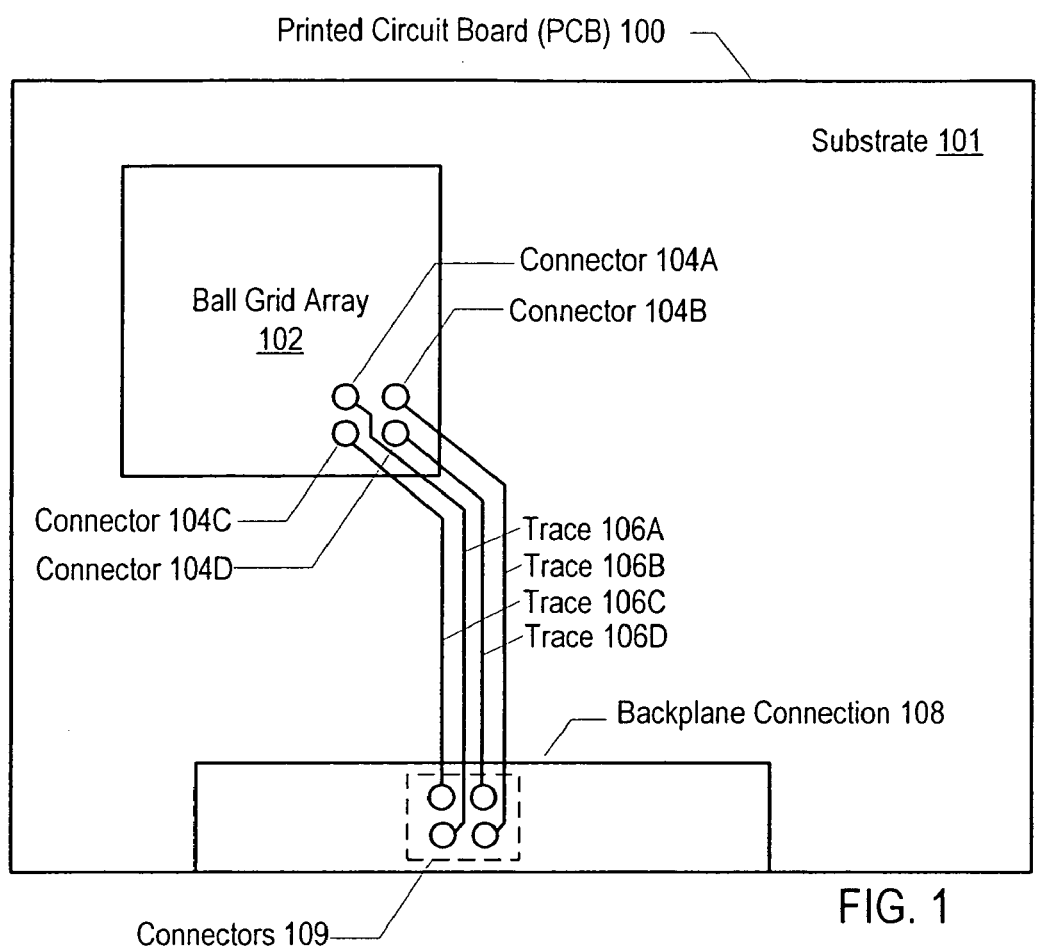
FIG. 1 illustrates a top view of a printed circuit board, according to an embodiment of the present invention.

While the invention is susceptible to various modifications and alternative forms, specific embodiments of the invention are provided as examples in the drawings and detailed description. It should be understood that the drawings and detailed description are not intended to limit the invention to the particular form disclosed. Instead, the intention is to cover all modifications, equivalents and alternatives falling within the spirit and scope of the invention as defined by the appended claims.

DETAILED DESCRIPTION

FIG. 1 illustrates a top view of printed circuit board 100. Printed circuit board includes substrate 101, ball grid array 102, connectors 104A–104D, traces 106A–106D, and backplane connector 108. Backplane connector 108 includes several signal connections 109. It is noted that FIG. 1 is meant to provide an example of the types of components that may be present on a printed circuit board but is not necessarily representative of the scale of the various types of components relative to each other and/or to the printed circuit board itself. Additionally, other embodiments can include different types and/or numbers of printed circuit board components.

In some embodiments, substrate 101 is a multi-layer substrate. For example, substrate 101 can include several routing layers. Traces, such as traces 106A–106D, can be routed on each of the different routing layers. For example, traces 106A and 106C can be routed on one routing layer, and traces 106B and 106D can be routed on a different routing layer.

Ball grid array (BGA) 102 is an example of a connector that can be used to couple an integrated circuit (not shown) to printed circuit board 101. Ball grid array 102 includes connectors, such as connectors 104A–104D, that are configured to be coupled to an I/O (Input/Output) lead of an integrated circuit. Connectors 104A–104D each include a conducting pad configured to be coupled to a conductor on an integrated circuit by a solder ball formed on the underside of the integrated circuit. It is noted that a connector array can include a significantly larger number of connectors than are shown in FIG. 1. In other embodiments, connector technologies other than BGA are used to couple integrated circuits to printed circuit board 101.

Each connector 104A–104D is coupled to a respective one of traces 106A–106D. The traces convey signals to and from the connectors. This allows an integrated circuit coupled to printed circuit board 100 by connectors 104A–104D to communicate with other devices on printed circuit board 100 and/or with devices external to printed circuit board 100. For example, FIG. 1 illustrates how at least some of signals operated on by such an integrated circuit can be communicated to connectors 109 included in backplane connector 108. In some embodiments, traces 106A and 106D convey one signal pair, and traces 106B and 106C convey another signal pair. The two signal pairs can be generated by an integrated circuit coupled to printed circuit board 100 by connectors 104A–104D and provided to backplane connection 108 by traces 106A–106D. Alternatively, the two signal pairs can be generated by a component on the backplane or on another printed circuit board coupled to the backplane and provided from backplane connection 108 to an integrated circuit coupled to connectors 104A–104D by traces 106A–106D. Similarly, one signal pair can be generated by such an integrated circuit, while the other signal pair is generated by a component on the backplane or another printed circuit board.

Backplane connector 108 couples printed circuit board to a backplane (now shown). The backplane can provide an attachment point for several other printed circuit boards and allow the attached printed circuit boards to communicate various signals between each other. The backplane can also provide various signals, such as a power signal, to each attached printed circuit board. These signals can be conveyed to integrated circuits on each printed circuit board.

In this example, connectors 104A and 104B are located on a top layer of printed circuit board 100. Traces such as traces 106A–106D can be formed on each routing layer. For example, traces 106A and 106B can be formed on a routing layer that is underneath the top routing layer. Since traces 106A and 106B are not formed on the top routing layer, vias are needed to respectively connect connectors 104A and 104D to traces 106A and 106D.

Figure 2A:
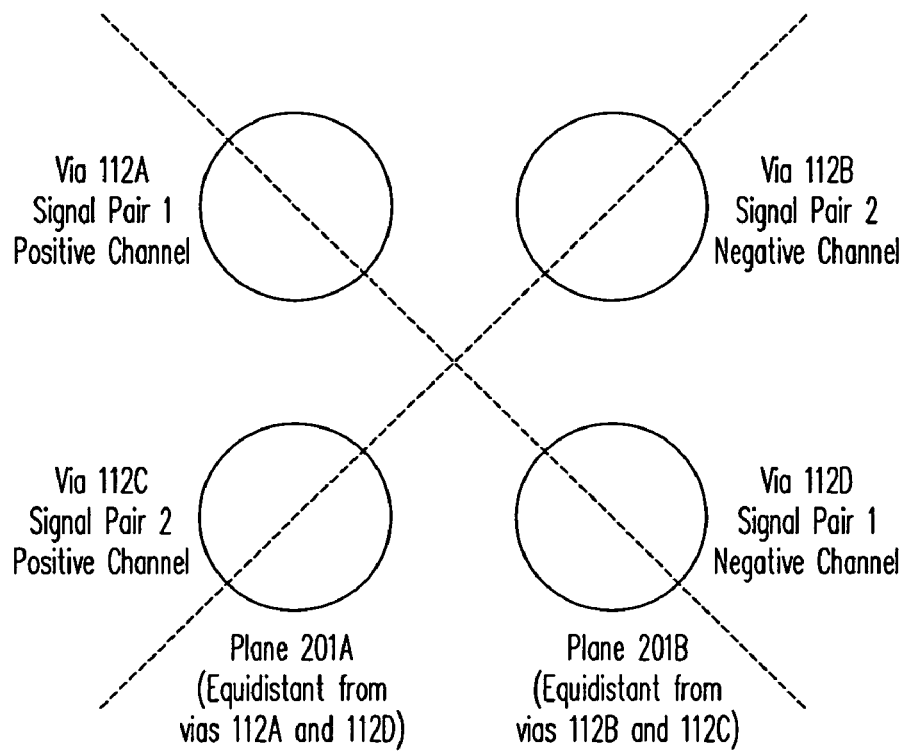
FIG. 2A illustrates an arrangement of two pairs of vias, each of which conveys a respective signal pair.

FIG. 2A illustrates an arrangement of two pairs of vias, each of which conveys a respective signal pair. One pair of vias, which includes vias 112A and 112D, conveys signal pair 1, and the other pair of vias, which includes vias 112B and 112C, conveys signal pair 2. Each signal pair can be a differential signal pair (as shown in this example) or another signal pair that includes two related signals, such as a signal pair that includes two signals that are 180 degree out of phase with each other.

In this example, the signal pairs are differential signal pairs. Via 112A conveys the positive channel of signal pair 1. Via 112B conveys the negative channel of signal pair 2. Via 112C conveys the positive channel of signal pair 2. Via 112D conveys the negative channel of signal pair 1. In one embodiment, each signal pair is a pair of signals having a data rate greater than about 250 megabits per second.

Via 112A and via 112D are located in plane 201B. Plane 201B is equidistant from vias 112B and 112C. Similarly, vias 112B and 112C are located in plane 201A. Plane 201A is equidistant from vias 112A and 112D. In the embodiment shown in FIG. 2A, vias 112A–112D are arranged in their respective planes such that each via is located at the corner of a square.

It is noted that the location of plane 201B is 'substantially' equidistant from both via 112B and via 112C, as opposed to being perfectly equidistant (plane 201A is similarly substantially equidistant from via 112A and 112D). The precision with which plane 201B is located depends on a variety of factors, including the precision of the measurements used to select the location of each via and the precision of the mechanisms used to form vias 112A and 112D in the printed circuit board. For example, due to use of a less precise measurement, plane 201B may be slightly closer to via 112C than it is to via 112B. Similarly, one end of plane 2011 may be slightly closer to via 112C and the other end of plane 201B may be slightly closer to via 112B. Such arrangements of plane 201B, even though not perfectly equidistant from vias 112C and 112B, can still provide a satisfactory amount of crosstalk cancellation.

Since via 112B is located in plane 201A, via 112B is substantially equidistant from vias 112A and 112D. Since each signal in signal pair 1 is approximately the same distance from the signals conveyed by vias 112B and 112C, the crosstalk effect (as seen by the component that receives signal pair 2 conveyed by vias 112B and 112C) of signal pair 1 on the signal conveyed by via 112B is reduced by the crosstalk effect of signal pair 1 on the signal conveyed by via 112C. In some embodiments, the crosstalk effect caused by signal pair 1 on one signal in signal pair 2 is substantially canceled by the crosstalk effect caused by signal pair 1 on the other signal in signal pair 2. For example, if signal pair 2 is a differential signal pair, the noise injected to the positive channel (conveyed by via 112C) of the differential signal pair will have a 180 degree phase shift relative to the noise injected into the negative channel (conveyed by via 112B) of the differential signal pair. When differential signal pair 2 is received, the phase shift between the noise injected into the different channels of the differential signal pair will substantially cancel out the effective noise seen by the receiver.

The arrangement shown in FIG. 2A allows vias carrying different signal pairs to be arranged in relatively close proximity to each other and/or reduces the noise caused by crosstalk between the vias. For example, no isolation vias or extra spacing is provided between vias 112B (which conveys the negative channel of signal pair 2) and 112A (which conveys the positive channel of signal pair 1). To provide the same resistance to crosstalk without arranging each pair of vias in the plane located between the other pair of vias (as shown in FIG. 2A), isolation vias or increased spacing would be needed to separate the vias carrying the different signal pairs. Accordingly, a given level of noise due to crosstalk can be maintained for a more dense arrangement of the four vias if each pair of vias is located in a plane substantially equidistant from each via in the other pair of vias. In other embodiments, an arrangement of vias like that shown in FIG. 2A provide improved density and reduced noise due to crosstalk. In still other embodiments, such an arrangement of vias provides reduced noise due to crosstalk for a given density of vias.

Vias 112A–112D, as shown in FIG. 2A, can be arranged underneath connectors used to couple an integrated circuit to a printed circuit board (e.g., as shown in FIG. 1). An integrated circuit designed to be coupled to a printed circuit board that has the via arrangement shown in FIG. 2A will have input and/or output connectors arranged in a corresponding configuration so that the appropriate signal pairs will be provided to and/or received from vias 112A–112D.

It is noted that unless traces on the top layer of the printed circuit board are provided to couple to the input and/or output connectors of the integrated circuit, vias will be needed to convey input and/or output signals to and/or from the integrated circuit's connectors. For example, in a BGA configuration, unless the printed circuit board includes traces configured to be coupled to solder ball connectors on the integrated circuit, the integrated circuit will include vias that are configured to be coupled to the solder ball connectors. In those situations, an arrangement of vias such as the one shown in FIG. 2A can allow a more dense arrangement of the integrated circuit's connectors and/or reduce the noise caused by crosstalk between signal pairs conveyed by the vias.

Figure 2B:
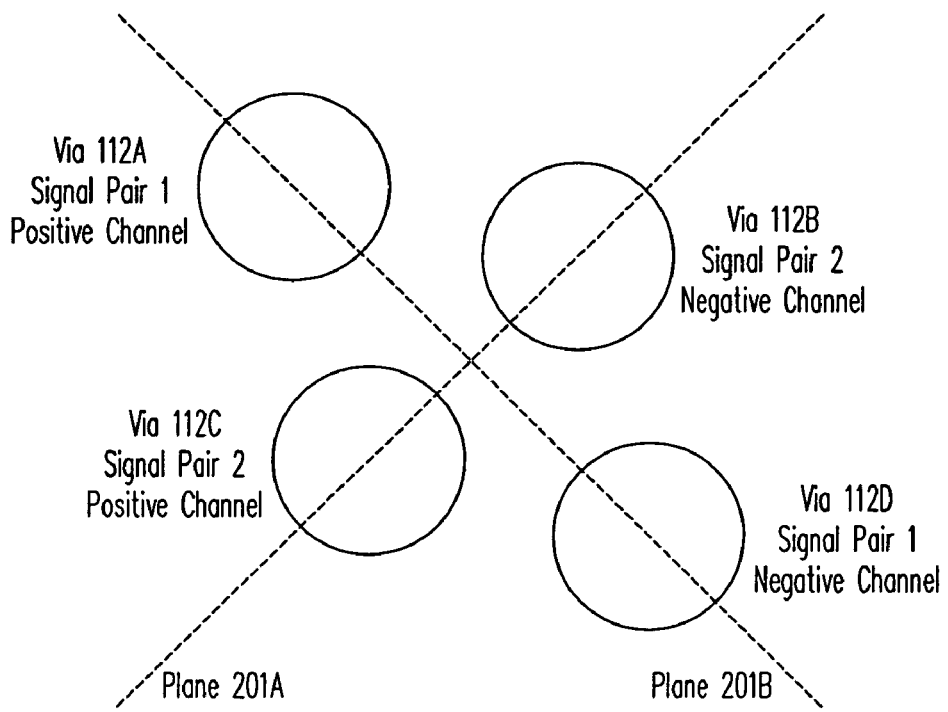
FIG. 2B illustrates another arrangement of two pairs of vias, each of which conveys a respective signal pair.

FIG. 2B shows a slightly different arrangement of two pairs of vias. In this example, the distance between vias 112B and 112C is different than the distance between vias 112A and 112D. However, vias 112B and 112C are still located in plane 201A, and vias 112A and 112D are still located in plane 201B. In contrast to FIG. 2A, the vias of FIG. 2B are not arranged so that each via is located at the corner of a square. As will be appreciated, all or some of the aforementioned advantages regarding crosstalk can still be provided by the embodiment of FIG. 2B, despite the differences in arrangement from the embodiment of FIG. 2A. It is noted that still other configurations, in addition to the configurations provided as examples in FIGS. 2A and 2B, can be implemented in other embodiments, and that these other configurations can also provide all or some of the aforementioned advantages.

Figure 3:
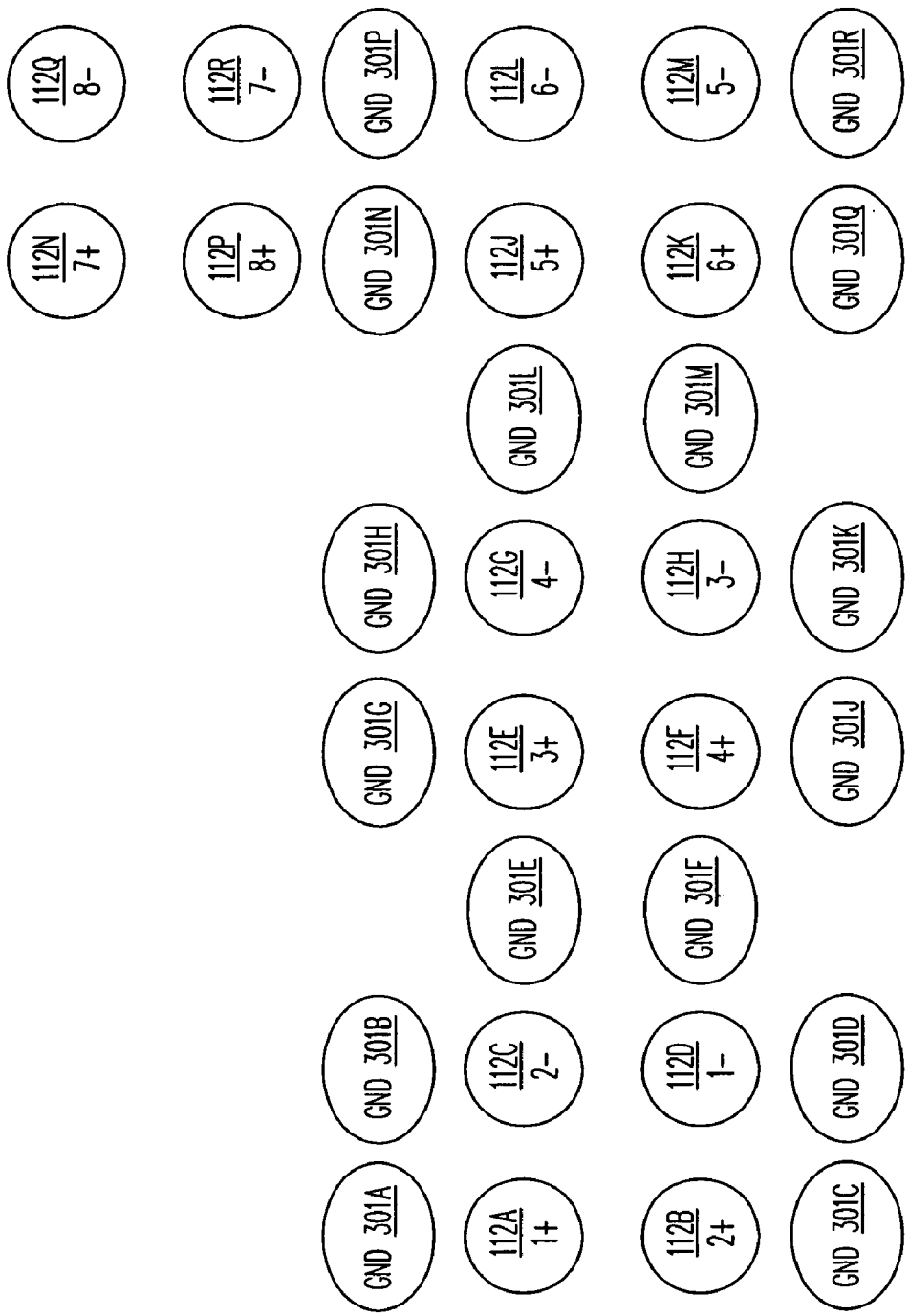
FIG. 3 illustrates how several two-pair groups of vias, as shown in FIG. 2A, can be arranged relative to each other in a printed circuit board, according to an embodiment of the present invention.

FIG. 3 illustrates how several two-pair groups of vias, as shown in FIG. 2A, can be arranged relative to each other in a printed circuit board, according to one embodiment. In this example, there are four two-pair groups of vias: vias 112A–112D, vias 112E–112H, vias 112J–112M, and vias 112N–112R. Each two-pair group of vias conveys two signal pairs.

The first two-pair group of vias includes vias 112A–112D and conveys signal pairs 1 and 2. The positive channel of signal pair 1 (labeled "1+") is conveyed by via 112A, the positive channel (2+) of signal pair 2 is conveyed by via 112B, the negative channel (2−) of signal pair 2 is conveyed by via 112C, and the negative channel (1−) of signal pair 1 is conveyed by via 112D. Similarly, vias 112E–112H convey signal pairs 3 and 4, vias 112J–112M convey signal pairs 5 and 6, and vias 112N–112R convey signal pairs 7 and 8.

Within each two-pair group, the vias that convey one signal pair are located in the plane substantially equidistant from the vias that convey the other signal pair, and vice versa. For example, vias 112P and 112Q, which convey signal pair 8, are located in the plane that is substantially equidistant from vias 112N and 112R, which convey signal pair 7. Vias 112N and 112R are similarly located in the plane that is substantially equidistant from vias 112P and 112Q.

The signals conveyed by vias 112A–112D are isolated from other signals being conveyed by surrounding vias by ground vias 301A–301F. Signal pairs 1 and 2 are isolated from crosstalk effects that might otherwise be caused by neighboring signals but for the presence of the ground vias. In particular, ground vias 301E–301F isolate vias 112A–112D from vias 112E–112H. Vias 112E–112F are similarly isolated from vias 112A–112D by ground vias 301E–301F. Vias 112E–112F are isolated from vias on other sides by ground vias 301G–301K. Ground vias 301L–301K isolate vias 112–112H from vias 112J–112M.

Vias 112J–112M are isolated from other vias by ground vias 301L–301R. Particularly, ground vias 301L–301M isolate vias 112J–112M from vias 112E–112H, and ground vias 301N–301P isolate vias 112J–112M from vias 112N–112R. Vias 112N–112R are similarly isolated from other vias by ground vias 301N–301P.

As shown in FIG. 3, each two-pair group of vias is electromagnetically isolated from each other two-pair group of vias by one or more isolation vias placed between neighboring two-pair groups of vias. In the illustrated embodiment, each isolation via is a ground via (e.g., any of ground vias 301A–301R) that is electrically connected to a ground plane within the printed circuit board.

Figure 4:
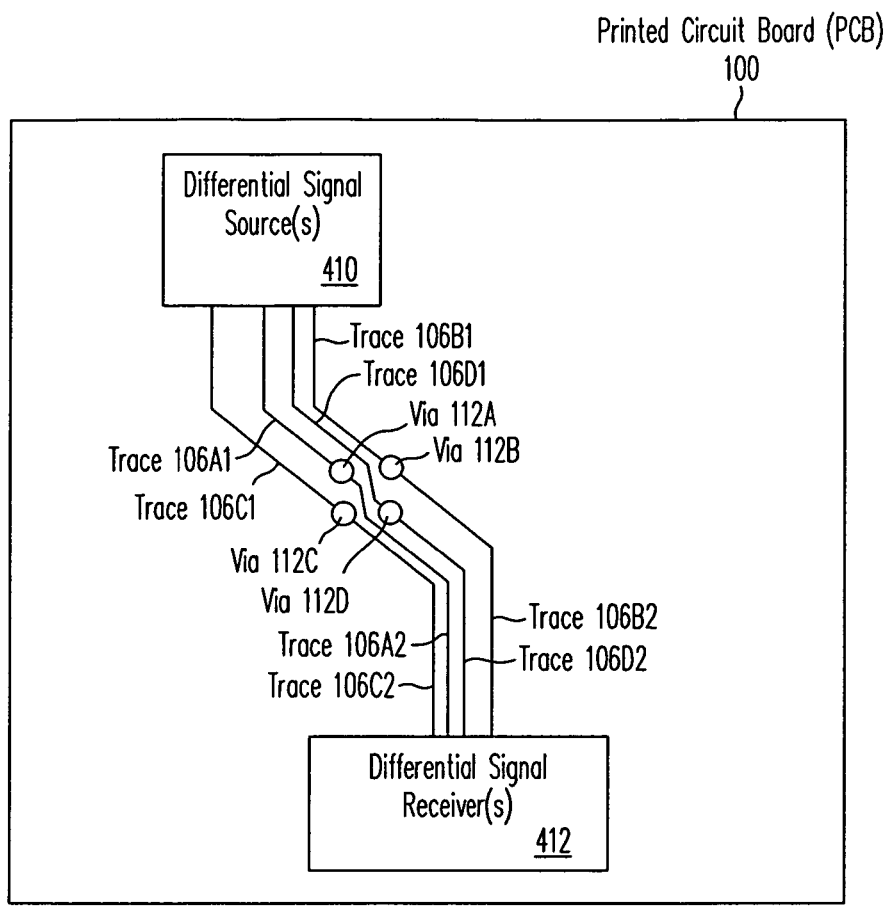
FIG. 4 shows a top view of a printed circuit board that includes a group of two pairs of vias arranged similarly to the group of vias shown in FIG. 2A.

FIG. 4 shows a top view of a printed circuit board that includes a group of two pairs of vias, 112A–112D, arranged similarly to the group of vias shown in FIG. 2A. Each via 112A–112D is coupled to differential signal source 410 by a respective trace 106A1–106D1. For example, via 112A is coupled to differential signal source 410 by trace 106A1, via 112B is coupled to differential signal source 410 by trace 106B1, via 112C is coupled to differential signal source 410 by trace 106C1, and via 112D is coupled to differential signal source 410 by trace 106D1. Differential signal source 410 includes a differential signal source for a first signal pair, which is conveyed by vias 112A and 112D, and for a second signal pair, which is conveyed by vias 112B and 112C. Differential signal source 410 can be included in an integrated circuit in some embodiments.

Each via 112A–112D is also coupled to differential signal receiver 412 by a respective one of traces 106A2–106B2. For example, via 112A is coupled to differential signal receiver 412 by trace 106A2, via 112B is coupled to differential signal receiver 412 by trace 106B2, via 112C is coupled to differential signal receiver 412 by trace 106C2, and via 112D is coupled to differential signal receiver 412 by trace 106D2.

It is noted that while differential signal source 410 and differential signal receiver 412 are each shown as a single device in FIG. 4, these components can be implemented as separate components in other embodiments. For example, the differential signal source of the differential signal pair conveyed by vias 112A and 112D may be included in a different integrated circuit than the differential signal source for the differential signal pair conveyed by vias 112B and 112C.

The traces conveying each of the two signal pairs can be on different layers of printed circuit board 100. For example, in one embodiment, traces 106A1 and 106D1, which convey one signal pair, are located on an adjacent routing layer to the routing layer on which traces 106B1 and 106C1, which convey the other signal pair, are located. In another embodiment, traces 106A1–106D1 are located on the same routing layer. In some embodiments, the traces conveying a given signal pair are routed as a loosely coupled differential pair, which means that the traces conveying that signal pair may not maintain a fixed spacing between each other.

The skew of each pair of traces (a pair of traces includes traces that convey signals in the same signal pair) is matched at both vias 112A–112D and at differential signal receiver 412. For example, vias 112A and 112D convey one signal pair. Traces 106A1 and 106D1 each convey one of the signals in that signal pair from differential signal source 410 to vias 112A and 112D. The skew of trace 106A1 at the point trace 106A1 couples to via 112A is matched to the skew of trace 106D1 at the point trace 106D1 couples to via 112D. Similarly, the skew of traces 106B1 and 106C1 is matched at vias 112B and 112C, respectively. In some embodiments, matching the skew between a given pair of traces involves matching the electrical length of that pair of traces.

The skew of trace 106A2 at the point trace 106A2 couples to differential signal receiver 412 is matched to the skew of trace 106D2 at the point trace 106D2 couples to differential signal receiver 412. The skew of traces 106B2 and 106C2 is similarly matched at differential signal receiver 412.

Figure 5:
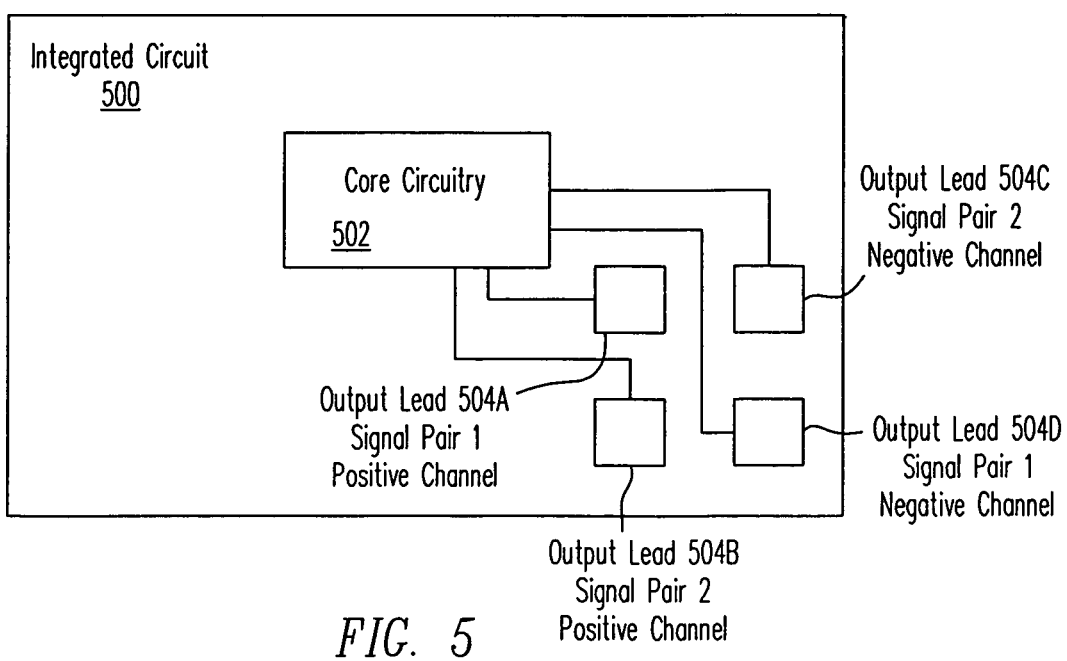
FIG. 5 illustrates an integrated circuit that includes output leads configured to be coupled to a printed circuit board having a via arrangement such as the one shown in FIG. 2A.

FIG. 5 illustrates an integrated circuit that includes output leads configured to be coupled to a printed circuit board having a via arrangement such as the one shown in FIG. 2A. As shown in FIG. 5, integrated circuit 500 includes core circuitry 502 and several input and/or output leads 504A–504D. Input and/or output leads 504A–504D each convey a signal between core circuitry 502 and a printed circuit board. Core circuitry 502 is configured to process a first signal pair and a second signal pair.

Core circuitry 502 can process each of the signal pairs by generating or receiving that signal pair. For example, core circuitry 502 can include a differential signal source configured to generate the first signal pair. Similarly, core circuitry 502 can include a differential signal receiver that receives the second signal pair and operates in response to the second signal pair. For example, the second signal pair can be a differential clock signal that controls the operation of the differential signal receiver.

Core circuitry 502 communicates the first and second signal pairs to and/or from the printed circuit board by way of input and/or output leads 504A–504D. Input and/or output leads 504A–504D are designed to be used in a BGA configuration in one embodiment (e.g., each lead can include a solder ball configured to be coupled to a corresponding connector on a printed circuit board).

A first pair of leads, leads 504A and 504D, conveys signal pair 1, while a second pair of leads, leads 504B and 504C, convey signal pair 2. Leads 504A and 504D are positioned in a plane that is substantially equidistant from leads 504B and 504C. Similarly, leads 504B and 504C are positioned in a plane that is substantially equidistant from leads 504A and 504D. This arrangement of the leads is similar to the via arrangement shown in FIG. 2A. By having such an arrangement, integrated circuit 500 can be coupled to a printed circuit board that features a via arrangement like that shown in FIG. 2A.

Figure 6:
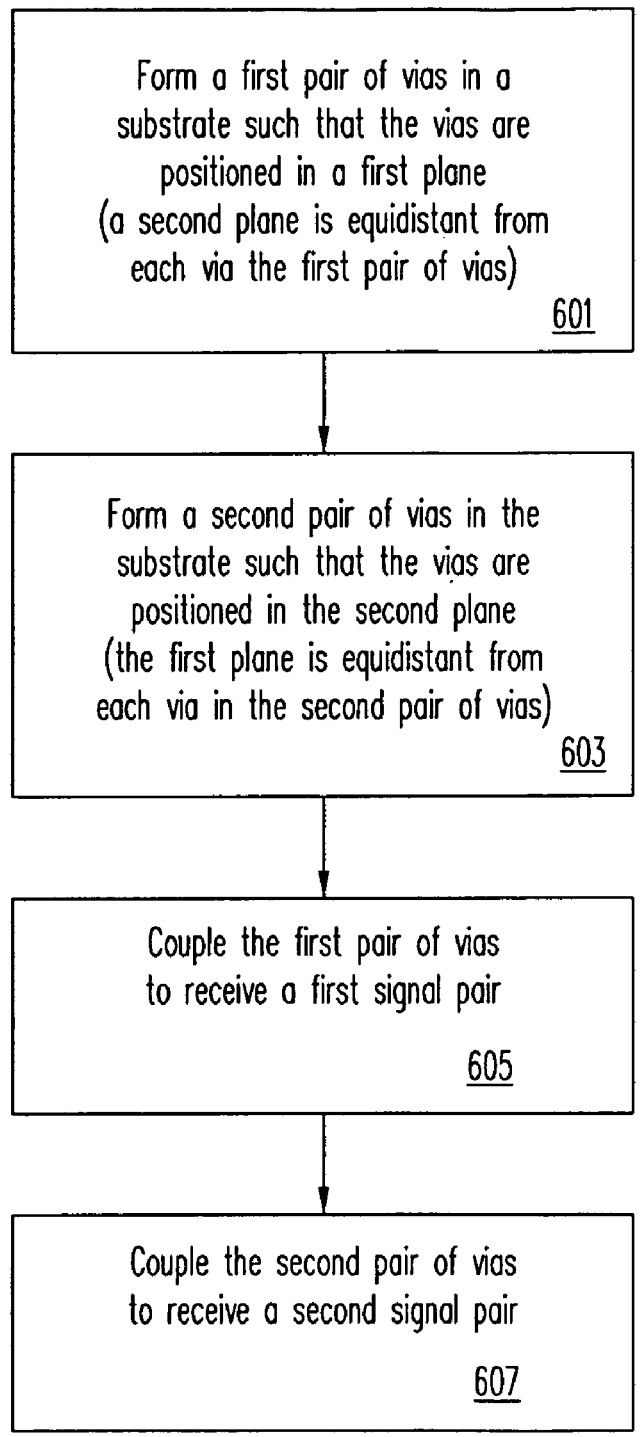
FIG. 6 is a flowchart of one embodiment of a method of making a printed circuit board having a via arrangement such as those shown in FIGS. 2A–2B.

FIG. 6 is a flowchart of one embodiment of a method of making a printed circuit board having a via arrangement like the arrangements shown in FIGS. 2A–2B. At 601, a first pair of vias is formed in a substrate such that the vias are positioned in a first plane. A second plane is equidistant from each via the first pair of vias.

At 603, a second pair of vias is formed in the substrate such that the vias are positioned in the second plane. The first plane is equidistant from each via in the second pair of vias. In some embodiments, the performance of functions 601 and 603 can arrange the two pairs of vias so that each via is located at a respective corner of a square. The first plane and the second plane each form a respective diagonal of the square.

At 605, the first pair of vias is coupled to receive a first signal pair. For example, the first pair of vias can be coupled to receive a differential signal pair. Coupling the first pair of vias to receive a signal pair can involve electrically connecting each via in the first pair of vias to a respective BGA connector (non-BGA connection technologies can be used in other embodiments). The vias can be directly connected to the respective BGA connectors (e.g., each via can be located directly underneath the BGA connector to which that via is connected) or indirectly (e.g., a trace leading away from the BGA connector can couple the via the BGA connector). The respective BGA connectors are coupled to receive the differential signal pair from a differential signal source in an integrated circuit or to provide the differential signal pair to a differential signal receiver included in an integrated circuit. An integrated circuit having an appropriate lead configuration can then be coupled to the BGA connectors.

The second pair of vias is coupled to receive a second differential signal pair at 607. The second pair of vias can be coupled to receive the second differential signal pair in similar ways to those described above for the first pair of vias.

In some embodiments, additional groups of similarly arranged two-pair groups of vias are formed on the printed circuit board. For example, in one embodiment, a third and a fourth pair of vias are formed in the substrate. The third pair of vias is positioned in a third plane, which is substantially equidistant from each via in the fourth pair of vias. Similarly, the fourth pair of vias is located in a fourth plane, which is substantially equidistant from each via in the third pair of vias. Neighboring two-pair groups of vias can be isolated from each other by forming isolation vias between the neighboring two-pair groups.

Each pair of vias can be coupled to additional printed circuit board components by a pair of traces. The skew of each pair of traces can be matched between the differential signal source and the vias and between the vias and the differential signal receiver.

Although the present invention has been described with respect to specific embodiments thereof, various changes and modifications may be suggested to one skilled in the art. It is intended such changes and modifications fall within the scope of the appended claims.

What is claimed is:

1. A printed circuit board, comprising:
   a substrate;
   a first pair of vias in the substrate; and
   a second pair of vias in the substrate; wherein
   the first pair of vias is configured to convey a first signal pair and the second pair of vias is configured to convey a second signal pair;
   the first pair of vias is positioned in a first plane,
   each point in the first plane is substantially equidistant from each via in the second pair of vias,
   the second pair of vias is positioned in a second plane,
   each point in the second plane is substantially equidistant from each via in the first pair of vias.

2. The printed circuit board of claim 1, wherein
   the first signal pair is a first differential signal pair, and
   the second signal pair is a second differential signal pair.

3. The printed circuit board of claim 2, further comprising:
   a plurality of Ball Grid Array (BGA) connectors, wherein
   each via in the first pair of vias and the second pair of vias is coupled to a respective one of the plurality of BGA connectors.

4. The printed circuit board of claim 2, further comprising:
   a first differential signal source coupled to each via in the first pair of vias, wherein
   the first differential signal source is configured to generate the first differential signal pair conveyed by the first pair of vias.

5. The printed circuit board of claim 2, further comprising:
   a plurality of isolation vias, wherein
   the plurality of isolation vias substantially electromagnetically isolate the first pair of vias and the second pair of vias from a third pair of vias and a fourth pair of vias.

6. The printed circuit board of claim 5, wherein
the third pair of vias and the fourth pair of vias are each configured to convey a respective differential signal pair,
the third pair of vias is positioned in a third plane,
the third plane is substantially equidistant from each via comprised in the fourth pair of vias,
the fourth pair of vias is positioned in a fourth plane, and
the fourth plane is substantially equidistant from each via included in the third pair of vias.

7. The printed circuit board of claim 2, wherein
a skew of a first pair of traces is matched at a point at which the first pair of traces couples to the first pair of vias.

8. The printed circuit board of claim 7, wherein
a skew of a second pair of traces is matched at a point at which the second pair of traces couples to the second pair of vias.

9. The printed circuit board of claim 8, wherein
the first pair of traces are routed on a same layer as the second pair of traces.

10. The printed circuit board of claim 8, wherein
the first pair of traces are routed on an adjacent layer to the second pair of traces.

11. The printed circuit board of claim 2, wherein
the first pair of vias is configured to convey a positive differential signal and a negative differential signal;
the first pair of vias is positioned relative to the second pair of vias such that a crosstalk effect caused by the second signal pair on the positive differential signal reduces a crosstalk effect caused by the second signal pair of the negative differential signal.

12. The printed circuit board of claim 11, wherein
the first pair of vias is positioned relative to the second pair of vias such that a crosstalk effect caused by the second signal pair on the positive differential signal substantially cancels a crosstalk effect caused by the second signal pair of the negative differential signal.

13. The printed circuit board of claim 2, wherein
the first pair of vias is configured to convey the first differential signal pair at a data rate greater than 250 megabits per second.

14. A printed circuit board, comprising:
a substrate;
a first pair of vias in the substrate; and
a second pair of vias in the substrate, wherein
  the first pair of vias is configured to convey a first signal pair comprising a first positive signal and a first negative signal,
  the second pair of vias is configured to convey a second signal pair comprising a second positive signal and a second negative signal,
  the first pair of vias is positioned relative to the second pair of vias such that a crosstalk effect caused by the first signal pair on the second positive signal reduces a crosstalk effect caused by the first signal pair on the second negative signal.

15. The printed circuit board of claim 14, wherein
the second pair of vias is positioned relative to the first pair of vias such that a crosstalk effect caused by the second signal pair on the first positive signal reduces a crosstalk effect caused by the second signal pair on the first negative signal.

16. The printed circuit board of claim 15, wherein
the first positive signal and the first negative signal are comprised in a first differential signal pair, and the second positive signal and the second negative signal are comprised in a second differential signal pair.

17. The printed circuit board of claim 14, wherein
a skew of a first pair of traces is matched at a point at which the first pair of traces couples to the first pair of vias.

18. The printed circuit board of claim 17, wherein
a skew of a second pair of traces is matched at a point at which the second pair of traces couples to the second pair of vias.

19. The printed circuit board of claim 14, further comprising:
a plurality of Ball Grid Array (BGA) connectors, wherein
each via in the first pair of vias and the second pair of vias is coupled to a respective one of the plurality of BGA connectors.

20. A method, comprising:
conveying a first signal pair, wherein a first pair of vias convey the first signal pair; and
conveying a second signal pair, wherein a second pair of vias convey the second signal pair, wherein
  the first pair of vias is positioned in a first plane,
  each point in the first plane is substantially equidistant from each via in the second pair of vias,
  the second pair of vias is positioned in a second plane, and
  each point in the second plane is substantially equidistant from each via in the first pair of vias.

21. The method of claim 20, wherein
the first signal pair is a first differential signal pair, and
the second signal pair is a second differential signal pair.

22. The method of claim 21, wherein
the first pair of vias is coupled to a first pair of Ball Grid Array (BGA) connectors,
the second pair of vias is coupled to a second pair of BGA connectors, and
the method further comprises:
  the first pair of BGA connectors providing the first differential signal pair to the first pair of vias, and
  the second pair of BGA connectors providing the second differential signal pair to the second pair of vias.

23. The method of claim 21, further comprising:
conveying a third differential signal pair, wherein a third pair of vias, which extend through the substrate, convey the third differential signal pair; and
conveying a fourth differential signal pair, wherein a fourth pair of vias, which extend through the substrate, convey the fourth differential signal pair, wherein
  the third pair of vias is positioned in a third plane,
  the third plane is substantially equidistant from each via in the fourth pair of vias,
  the fourth pair of vias is positioned in a fourth plane, and
  the fourth plane is substantially equidistant from each via in the third pair of vias.

24. The method of claim 23, wherein
the first pair of vias and the second pair of vias are substantially electromagnetically isolated from the third pair of vias and the fourth pair of vias.

25. The method of claim 21, wherein
a skew of a first pair of traces is matched at a point at which the first pair of traces couples to the first pair of vias.

26. The method of claim 25, wherein
a skew of a second pair of traces is matched at a point at which the second pair of traces couples to the second pair of vias.

27. The method of claim 21, wherein
the conveying the first differential signal pair comprises conveying the first differential signal pair at a data rate greater than 250 megabits per second.

28. A method, comprising:
forming a first pair of vias in a substrate, wherein the first pair of vias is positioned in a first plane;
forming a second pair of vias in the substrate, wherein the second pair of vias is positioned in a second plane;
coupling the first pair of vias to receive a first signal pair; and
coupling the second pair of vias to receive a second signal pair, wherein
each point in the first plane is substantially equidistant from each via in the second pair of vias, and
each point in the second plane is substantially equidistant from each via in the first pair of vias.

29. The method of claim 28, wherein
the first signal pair is a first differential signal pair, and the second signal pair is a second differential signal pair.

30. The method of claim 29, further comprising:
forming a third pair of vias in the substrate, wherein the third pair of vias is positioned in a third plane;
forming a fourth pair of vias in the substrate, wherein the fourth pair of vias is located in a fourth plane;
coupling the third pair of vias to receive a third differential signal pair; and
coupling the fourth pair of vias to receive a fourth differential signal pair, wherein
the third plane is substantially equidistant from each via in the fourth pair of vias, and
the fourth plane is substantially equidistant from each via in the third pair of vias.

31. The method of claim 30, further comprising:
substantially electromagnetically isolating the first pair of vias and the second pair of vias from the third pair of vias and the fourth pair of vias.

32. The method of claim 31, wherein
the substantially electromagnetically isolating comprises forming a plurality of isolation vias in the substrate.

33. The method of claim 29, wherein
the coupling the first pair of vias to receive the first differential signal pair comprises coupling the first pair of vias to a pair of Ball Grid Array (BGA) connectors.

34. The method of claim 33, further comprising:
coupling a first differential signal source to the pair of BGA connectors.

35. The method of claim 29, further comprising
matching a first skew of a first pair of traces at a point at which the first pair of traces couples to the first pair of vias.

36. The method of claim 35, further comprising
matching a second skew of a second pair of traces at a point at which the second pair of traces couples to the second pair of vias.

37. The method of claim 36, further comprising
forming the first pair of traces on a same layer as the second pair of traces.

38. An integrated circuit, comprising:
core circuitry configured to process a first signal pair and a second signal pair;
a first pair of leads coupled to the core circuitry and configured to convey the first signal pair; and
a second pair of leads coupled to the core circuitry and configured to convey the second signal pair, wherein
the first pair of leads is positioned in a first plane,
each point in the first plane is substantially equidistant from each lead in the second pair of leads,
the second pair of leads is positioned in a second plane, and
each point in the second plane is substantially equidistant from each lead in the first pair of leads.

39. The integrated circuit of claim 38, wherein
the first signal pair is a first differential signal pair, and the second signal pair is a second differential signal pair.

40. An apparatus, comprising:
a substrate;
means for conveying a first positive signal;
means for conveying a first negative signal;
means for conveying a second positive signal; and
means for conveying a second negative signal, wherein
the means for conveying the first positive signal, the means for conveying the first negative signal, the means for conveying the second positive signal, and the means for conveying the second negative signal are located in the substrate,
the first positive signal and the first negative signal are comprised in a first signal pair,
the second positive signal and the second negative signal are comprised in a second signal pair,
the means for conveying the first positive signal and the means for conveying the first negative signal are positioned in a first plane,
each point in the first plane is substantially equidistant from the means for conveying the second positive signal and the means for conveying the second negative signal,
the means for conveying the second positive signal and the means for conveying the second negative signal are positioned in a second plane, and
each point in the second plane is substantially equidistant from the means for conveying the first positive signal and the means for conveying the first negative signal.

41. The apparatus of claim 40, wherein
the first signal pair is a first differential signal pair, and the second signal pair is a second differential signal pair.

42. The apparatus of claim 41, further comprising:
means for generating the first differential signal pair, wherein the means for generating are coupled to the means for conveying the first positive signal and to the means for conveying the first negative signal.

43. The apparatus of claim 41, wherein
the means for conveying the first positive signal and the means for conveying the first negative signal are positioned relative to the means for conveying the second positive signal and the means for conveying the second negative signal such that a crosstalk effect caused by the first signal pair on the second positive signal reduces a crosstalk effect caused by the first signal pair on the second negative signal.

44. The apparatus of claim 43, wherein
the means for conveying the first positive signal and the means for conveying the first negative signal are positioned relative to the means for conveying the second positive signal and the means for conveying the second negative signal such that the crosstalk effect caused by the first signal pair on the second positive signal substantially cancels the crosstalk effect caused by the first signal pair on the second negative signal.

* * * * *